US 6,688,454 B2

(12) United States Patent
Cho et al.

(10) Patent No.: US 6,688,454 B2
(45) Date of Patent: Feb. 10, 2004

(54) STACKER FOR TRAY FEEDER

(75) Inventors: Jae Hyuk Cho, Kyungki-do (KR); Sang Won Lee, Kyungki-do (KR); Dong Suh Lee, Seoul (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 10/021,438

(22) Filed: Dec. 19, 2001

(65) Prior Publication Data

US 2002/0195314 A1 Dec. 26, 2002

(30) Foreign Application Priority Data

Jun. 22, 2001 (KR) ........................................ 2001-35774

(51) Int. Cl.⁷ .............................................. B65G 37/00
(52) U.S. Cl. ................................ 198/347.3; 198/347.1; 198/435; 414/793.8
(58) Field of Search ........................... 198/347.1, 347.2, 198/343.3, 435; 414/793.4, 793.6, 793.8, 794.6

(56) References Cited

U.S. PATENT DOCUMENTS

| | | | | |
|---|---|---|---|---|
| 2,693,135 A | * | 11/1954 | Frost ...................... | 198/435 X |
| 4,230,216 A | * | 10/1980 | Wiens ...................... | 198/347.3 |
| 5,097,936 A | * | 3/1992 | Dorner et al. ........ | 198/347.3 X |
| 5,441,146 A | * | 8/1995 | Ziegler ................ | 198/347.2 X |
| 5,735,380 A | * | 4/1998 | Schneider et al. ....... | 198/347.1 |
| 5,906,484 A | * | 5/1999 | Imai .................... | 198/347.1 X |
| 6,105,749 A | | 8/2000 | Block et al. ........... | 198/370.03 |

FOREIGN PATENT DOCUMENTS

DE 3800249 * 7/1988 ................. 198/435

* cited by examiner

Primary Examiner—James R. Bidwell
(74) Attorney, Agent, or Firm—Fleshner & Kim, LLP

(57) ABSTRACT

The present invention discloses a stacker for a tray feeder including: a plurality of frames for forming an outer portion of the stacker; an elevator capable of moving upwardly and downwardly and positioned at a side of an auxiliary frame of the plurality of frames; a driving means for driving the elevator; and a magazine for receiving the tray plates and mounted to the elevator. According to the present invention, the tray plate on which the electronic parts is positioned is precisely mounted by the magazine having the alignment bars due to operation of the stacker, and safely transferred to a predetermined position, to improve productivity and reliability.

22 Claims, 5 Drawing Sheets

Mount device side

STACKER FOR TRAY FEEDER

BACKGROUND OF THE INVENTION

1. Field of the Invention

The present invention relates to a stacker for a tray feeder, and in particular to an improved stacker for a tray feeder which can stably precisely transfer a tray on which electronic parts are mounted to an electronic parts mount device.

2. Description of the Background Art

In general, a flat-back type electronic parts implies an electronic parts received in a tray. It is mostly supplied to an electronic parts feeder.

Referring to FIGS. 1 and 2, in a conventional electronic parts feeder picking out the flat-back type electronic parts from the tray, a magazine 3 receiving the electronic parts 4 is supported by a lifter 7 lifted or lowered along a ball screw 6 driven by a motor 5. When the electronic parts 4 is selected, the lifter 7 is moved in a vertical direction. The magazine 3 receiving a tray plate 2 is connected at the upper portion of the lifter 7. When a position of the lifter 7 is decided, the tray plate 2 received in the magazine 3 is transferred by driving of a tray plate fetch unit 8.

Thereafter, a movement unit 10 having a moving nozzle 9 is operated to move or displace the electronic parts to a center table 11. The center table 11 where the electronic parts 4 are positioned is moved to the electronic parts mount device 1, thereby feeding the electronic parts 4.

In the conventional art, when the electronic parts mount device is operated, the lifter 7 of the electronic parts feeder 20 is moved in an upward/downward direction. However, while the electronic parts mount device is operated, it is impossible to supply the electronic parts.

In addition, there is a disadvantage that the electronic parts cannot be replaced during the operation of the electronic parts mount device, which reduces productivity.

SUMMARY OF THE INVENTION

Accordingly, it is an object of the present invention to provide a stacker for a tray feeder including a tray plate which can stably receive an electronic parts, a magazine which can stably receive the tray plate, and an elevator which can stably transfer the magazine.

In order to achieve the above-described object of the invention, there is provided a stacker for a tray feeder comprising: a plurality of frames for forming an outer portion of the stacker; an elevator capable of moving upwardly and downwardly and positioned at a side of an auxiliary frame of the plurality of frames; a driving means for driving the elevator; and a magazine for receiving the tray plates and mounted to the elevator.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
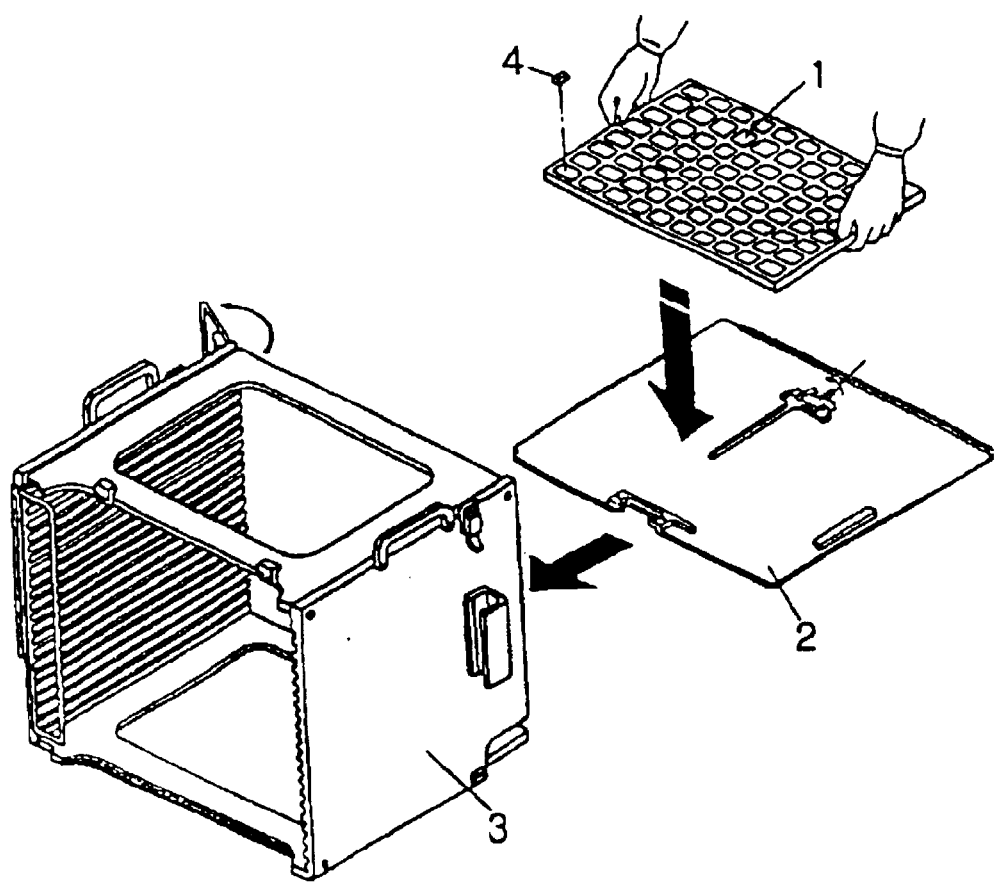
FIG. 1 is a perspective view illustrating a unit for receiving a tray to a magazine in a conventional electronic parts feeder.
Figure 2:
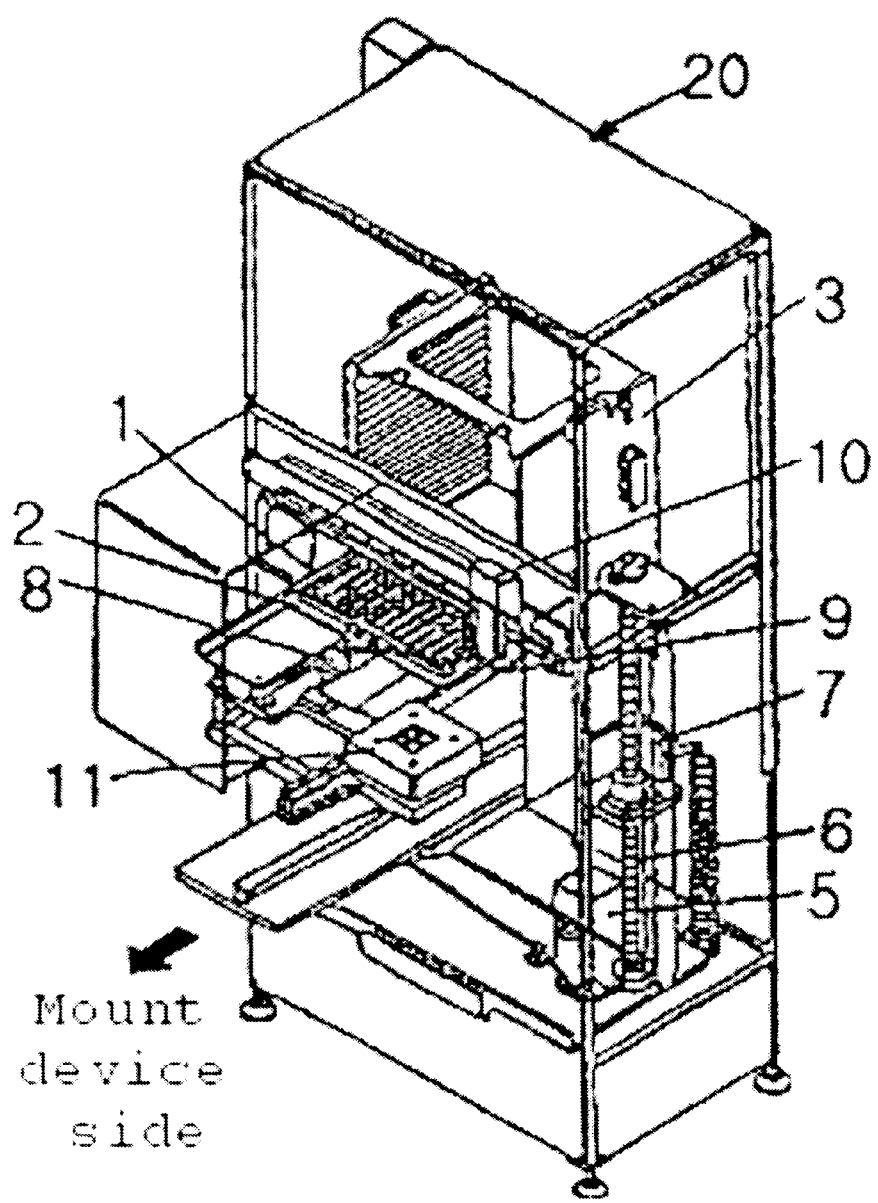
FIG. 2 is a perspective view illustrating the conventional electronic parts feeder.

A stacker for a tray feeder in accordance with a preferred embodiment of the present invention will now be described with reference to FIG. 3.

Firstly, the tray feeder (also known as an electronic parts feeder) includes a stacker 100 composing an outer portion of the tray feeder, a magazine 300, a transfer 400 and an exchange 500.

The stacker 100 includes a main frame 120 and a cover frame 110. The main frame 120 is composed of a plurality of horizontal frames 111, a plurality of vertical frames 112, a plurality of longitudinal frames 113 and a base unit 114.

A auxiliary frame 140 is provided to one side portion of the main frame 120, and the transfer 400 and the exchange 500 are connected to the upper portion of the main frame 120.

A motor 160 is installed at one side portion of the auxiliary frame 140, a ball screw 130 is connected to a motor shaft (not shown) of the motor 160, and one side portion of an elevator 200 is connected to the ball screw 130, thereby driving the elevator 200 by the motor 160.

A plurality of LM (linear motion) guides 141 are disposed on one surface of a auxiliary frame 140 to guide the elevator 200 positioned on the base unit 114.

A plurality of guide blocks 151 connected to one surface of the guide frame 150 connected to one side of the elevator 200 are inserted into the plurality of LM guides 141 formed on one surface of the auxiliary frame 140 in order to be moved along the plurality of LM guides 141.

On the other hand, the exchange 500 is positioned on the main frame 120 with the transfer 400, and a nozzle unit (not shown) for holding a tray plate 600 is disposed at one side portion of the exchange 500.

In addition, first and second plates 430 and 440 for transferring the tray plate 600 are provided at both upper end portions of the transfer 400 facing each other, and a driving unit (not shown) is disposed at one side portion of the transfer 400, so that the tray 450 on which the electronic parts is mounted can drive the first and second plates 430 and 440.

Figure 4:
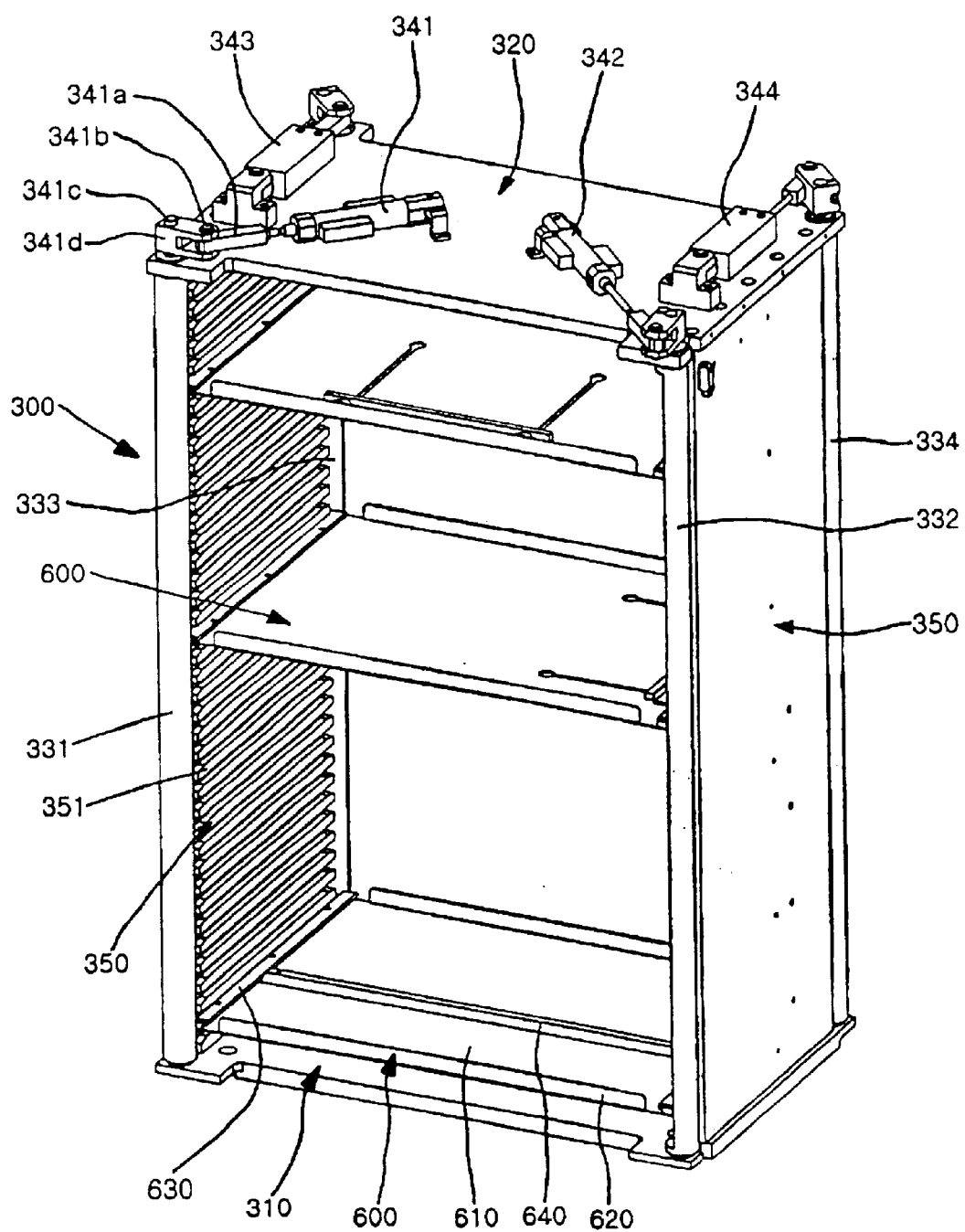
FIG. 4 is a perspective view illustrating a magazine mounted in the stacker.
Figure 5:
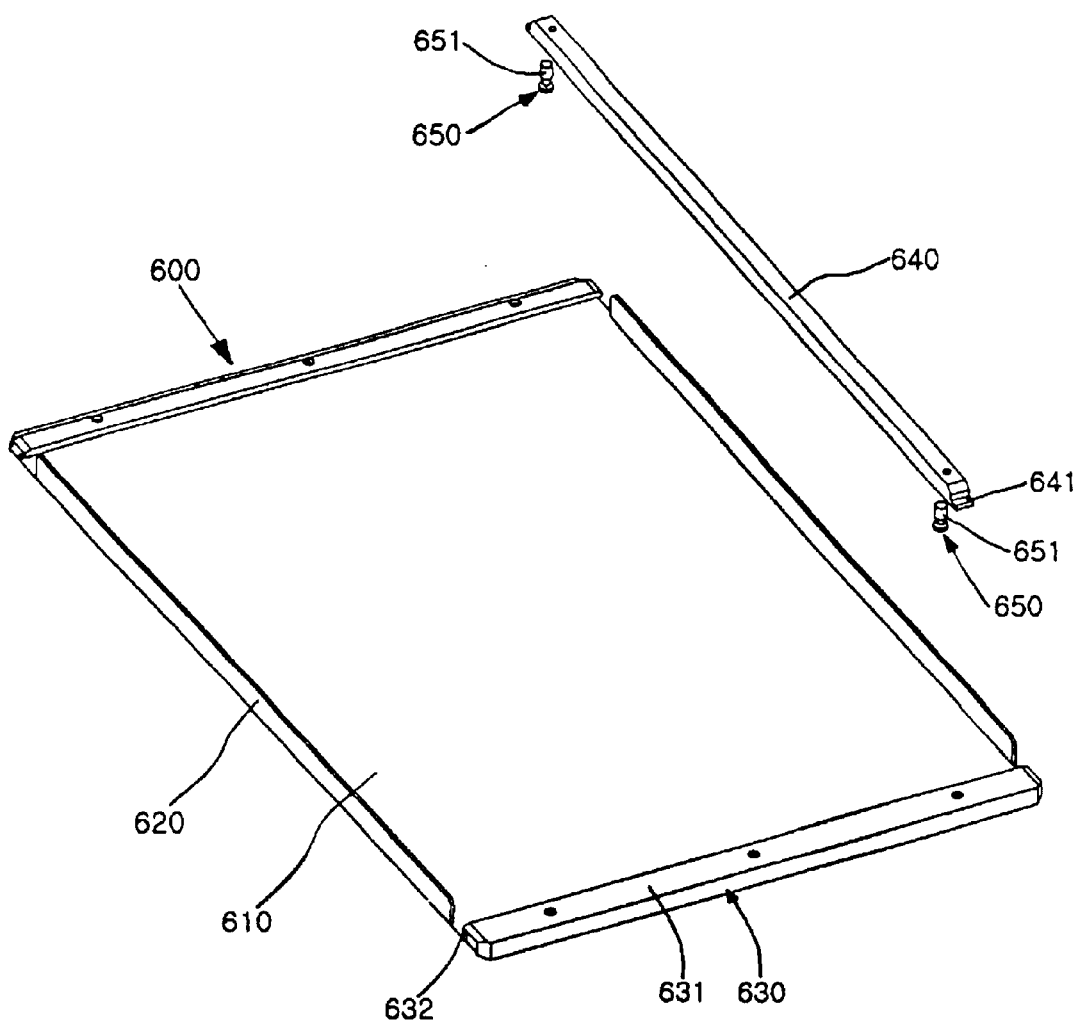
FIG. 5 is an exploded perspective view illustrating a tray plate received in the magazine.

FIG. 4 is a perspective view illustrating the magazine mounted in the stacker, and FIG. 5 is an exploded perspective view illustrating the tray plate received in the magazine.

As illustrated in FIGS. 4 and 5, the magazine 300 mounted on the elevator 200 includes a bottom plate 310, guide plates 350 and a top plate 320.

The bottom plate 310 is connected to the lower portion of the magazine 300, and the guide plates 350 are installed at both end portions of the bottom plate 310, separating from each other by a predetermined distance and facing with each other. A plurality of guide grooves 351 are formed at one side portions of the guide plates 350 to receive the plurality of tray plates 600.

The tray plate 600 includes a bottom surface 610, support jaws 620, support bar guides 630 and a tray support bar 640.

Figure 3:
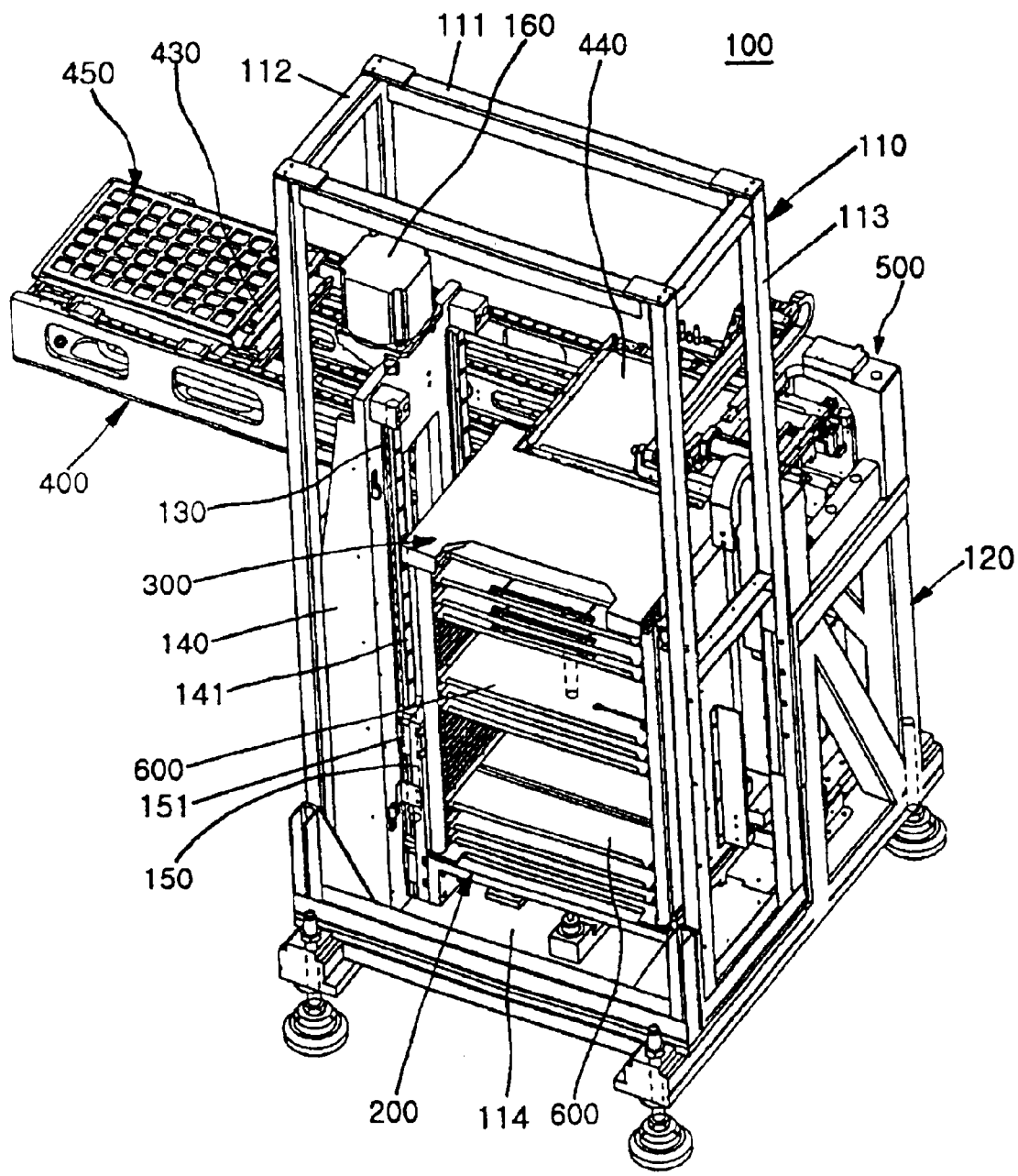
FIG. 3 is a perspective view illustrating a stacker for a tray feeder including an exchange in accordance with the present invention.

The support bar guides 630 are formed at both end portions of the bottom surface 610 of the tray plate 600, and the support jaws 620 having a predetermined width are disposed at both end portions of the tray plate 600 to be supported, sucked and held by the nozzle unit positioned at one side portion of the exchange 500 (refer to FIG. 3).

Support bar guide jaws 631 are formed at both end portions of the outer surface of the support bar guide 630 to be inserted into the guide groove 351 of the guide plate 350, and a support bar guide groove 632 is formed on the inner surface of the support bar guide 630 in order for the tray support bar 640 to be inserted thereinto.

A position of the tray support bar 640 is changed along the support bar guide grooves 632. Fixed pushers 650 having springs 651 are connected to the bottom portions of both end potions of the tray support bar 640. Here, the fixed pushers 650 have a tension, and are separated from each other by a predetermined distance. Protrusions 641 are formed at both end portions of the tray support bar 640, and inserted into the support bar guide groove 632 of the tray plate 600. The top plate 320 is connected to the upper portion of the guide plate 350.

A first cylinder 341, a second cylinder 342, a third cylinder 343 and a fourth cylinder 344 are installed at four edges of the top plate 320.

The first to fourth cylinders 341, 342, 343 and 344 have the identical constitution and connection state, and thus the first cylinder 341 will now be only explained.

The first cylinder 341 includes a piston 341a, a hinge 341b, a rotation shaft 341c and a rotation shaft support block 341d.

The first cylinder 341 is connected to the rotation shaft 341c with a predetermined length which is inserted into a predetermined portion of one edge of the top plate 320. One end portion of the rotation shaft 341c is connected to one end portion of a first alignment bar 331. The first alignment bar 331 rotated with the rotation shaft 341c supports one side portion of the tray plate 600 with a second alignment bar 332.

A flat surface (not shown) having a predetermined width is formed on the outer surface of the first alignment bar 331, for supporting both end portions of one side portion of the tray plate 600.

The rotation shaft support block 341d is fixed to and supported by the end portion of the rotation shaft 341c, the hinge 341b is connected to the end portion of the other side portion of the rotation shaft support block 341d, and the piston 341a is connected to the hinge 341b and performs a straight line movement by the first cylinder 341.

The operation and operation modes of the stacker for the tray feeder in accordance with the present invention will now be described in detail.

In the stacker for the tray feeder, the elevator 200 carrying the magazine receiving the plurality of tray plates 600 on which the tray 450 receiving the electronic parts 4 from the electronic parts feeder is mounted is lifted or lowered by the driving unit of the auxiliary frame 140 disposed at one side portion of the main frame 120.

When the ball screw 130 connected to the motor shaft (not shown) is rotated due to driving of the motor 160 of the driving unit, the plurality of guide blocks 151 of the guide frame 150 installed at one side portion of the elevator 200 lowers the elevator 200 along the plurality of LM guides 141 of the auxiliary frame 140 formed at one side portion of the main frame 120, and stops the elevator 200 at a predetermined position.

The cylinders 341, 342, 343 and 344 positioned at the upper portion of the magazine 300 mounted on the elevator 200 are operated. The constitution and operation of the first to fourth cylinders 341, 342, 343 and 344 are identical, and thus the first cylinder 341 will now be only explained.

When the piston 341a connected to the first cylinder 341 performs a forward movement due to driving of the first cylinder 341, the end portion of the piston 341a is inserted into the middle portion of the hinge 341b, and rotated. The rotation shaft support block 341d is inserted into both end portions of the hinge 341b, and rotated due to the forward movement of the piston 341a by a predetermined angle with the rotation shaft 341c inserted into the other end portion. One end portion of the rotation shaft 341c is connected to one end portion of the first alignment bar 331. When the first alignment bar 331 is rotated with the rotation shaft 341c, the first alignment bar 331 is rotated toward the outer portion of the magazine 300, so that the flat surface (not shown) of the first alignment bar 331 can be positioned on a straight line with the guide groove 351.

When the flat surfaces of the third and fourth alignment bars 333 and 334 having the same constitution and connection state as the first alignment bar 331 face each other, a space of an entrance of the magazine 300 is obtained to receive the tray plate 600.

When the tray plate 600 is received, the proceeded piston 341a is retreated due to reverse driving of the first cylinder 341, the hinge 341b connected to the piston 341a is pulled, and the rotation shaft support block 341d connected to the hinge 341b is rotated along the rotation shaft 341d in a direction of pulling the piston 341a. When the rotation shaft support block 341d is rotated, the rotation shaft support block 341d is rotated toward the magazine 300 with the rotation shaft 341c having its end portion inserted into the rotation shaft support block 341d. The third and fourth alignment bars 333 and 334 having their flat surfaces connected to face each other are rotated toward the magazine 300 due to driving of the third and fourth cylinders 343 and 344. Accordingly, the flat surfaces of the third and fourth alignment bars 333 and 334 support the support jaw 620 formed at one side portion of the tray plate 600, thereby achieving safety of the tray plate 600 when the magazine 300 is lifted or lowered.

When the third and fourth alignment bars 333 and 334 are rotated toward the outer portion of the magazine 300 due to driving of the third and fourth cylinders 343 and 344 formed on the magazine 300, and the flat surfaces of the third and fourth alignment bars 333 and 334 face each other, a space for receiving the tray plate 600 on which the electronic parts is mounted is obtained at the rear portion of the magazine 300, thereby receiving the tray plate 600.

When the receiving operation of the plurality of tray plates 600 is finished, the third and fourth cylinders 343 and 344 are inversely driven, and the facing third and fourth alignment bars 333 and 334 are respectively inversely rotated, thereby firmly supporting the support jaw 620 disposed at one side portion of the mounted tray plate 600.

At this time, when the magazine 300 is lifted by a predetermined distance due to reverse driving of the motor 160 installed at one side portion of the main frame 120 and stopped at a predetermined position, the first and second alignment bars 331 and 332 are rotated from the inner portion of the magazine 300 to the outer portion thereof due to driving of the first and second cylinders 341 and 342. When the flat surfaces of the first and second alignment bars 331 and 332 face each other, a space of an outlet of the magazine 300 is obtained to fetch the tray plate 600 from the inner portion of the magazine 300.

When the nozzle unit of the exchange 500 is forward-driven to held the tray plate 600 received in the magazine 300, moved in a backward direction to suck and support jaw 620 formed at one side portion of the tray plate 600, and stopped on the first plate 440 disposed at one upper end portion of the transfer 400, the tray plate 600 is mounted on the first plate 440 due to removal of an inhalation force of the nozzle unit (not shown) of the exchange 500.

Here, the tray plate 600 finishing the mounting operation of the electronic parts is mounted on the second plate 430 positioned at the other side end portion of the transfer 400. The first and second plates 440 and 430 are crossly moved in an upward/downward direction. Therefore, the first plate 440 is moved to the mount device, and the second plate 430 is moved to the exchange 500, thereby exchanging their positions.

The tray plate 600 mounted on the second plate 430 is sucked and held due to driving of the nozzle unit of the retreated exchange 500, and the nozzle unit of the exchange 500 is moved to the inner portion of the magazine 300 having the outlet space due to the first and second alignment bars 331 and 332. Thus, the tray plate 600 is received in the guide groove 351 formed on the guide plate 350 of the magazine 300.

When the receiving operation of the tray plate 600 is finished, the first and second alignment bars 331 and 332 are inversely rotated toward the inner portion of the magazine 300 due to driving of the first and second cylinders 341 and 342, thereby firmly supporting both ends of the support jaw 620 formed at one side portion of the received tray plate 600.

When the elevator 200 is lowered by driving of the motor 160 formed at one side portion of the auxiliary frame 140 and stopped at a predetermined position, the third and fourth alignment bars 333 and 334 are rotated due to driving of the third and fourth cylinders 343 and 344 installed on the magazine 300 mounted on the elevator 200, thereby obtaining the entrance space. Accordingly, the tray plate 600 is fetched to receive the electronic parts.

The protrusions 641 formed at both end portions of the tray support bar 640 are inserted into the guide groves 632 of the support bar guides 630 formed at both end portions of the upper portion of the bottom surface 610 of the fetched tray plate 600. In a state where the tray support bar 640 firmly supports the tray 450 receiving the electronic parts, the guide jaw 631 of the support bar guide 630 is guided to the guide groove 351 of the guide plate 350 formed in the magazine 300, and safely received in the magazine 300.

In accordance with the present invention, the tray on which the electronic parts is mounted is firmly supported by the support bar on the tray plate, the tray plate is safely received and supported by the plurality of alignment bars at the outer portion of the magazine, and thus the tray is safely precisely transferred by the elevator on which the magazine is mounted. Therefore, the electronic parts is easily fed to the corresponding device, which results in improved productivity and reliability.

As discussed earlier, the tray plate on which the electronic parts is positioned is precisely mounted by the magazine having the alignment bars due to operation of the stacker, and safely transferred to a predetermined position, to improve productivity and reliability.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A stacker for a tray feeder which carries and exchanges trays holding electronic parts between tray plates configured to hold the trays, the stacker for a tray feeder comprising:
    a plurality of frames configured to form an outer portion of the stacker;
    an elevator positioned at a side of an auxiliary frame of the plurality of frames and configured to move in an upward and a downward direction;
    a driver configured to drive the elevator;
    a transfer configured to transfer the trays of electronic parts from one tray plate to another; and
    a magazine mounted to the elevator and configured to hold a plurality of tray plates.

2. The stacker for a tray feeder according to claim 1, wherein the plurality of frames comprises a main frame and an auxiliary frame mounted to a side of the main frame, the main frame further comprising:
    a plurality of horizontal frames;
    a plurality of vertical frames;
    a plurality of longitudinal frames;
    a base unit; and
    a cover frame.

3. The stacker for a tray feeder according to claim 2, wherein the driver comprises a motor installed at a side portion of the auxiliary frame, a ball screw connected to a shaft of the motor and configured to move the elevator upwardly and downwardly by a driving force of the motor, and a plurality of linear motion guides disposed on a surface of the auxiliary frame and configured to guide the elevator.

4. The stacker for a tray feeder according to claim 3, further comprising a guide frame connected to a side of the elevator, wherein a plurality of guide blocks connected to a surface of the guide frame are configured to be inserted into the plurality of linear motion guides formed on a surface of the auxiliary frame, and to be moved along the plurality of linear motion guides.

5. The stacker for a tray feeder according to claim 1, wherein the magazine comprises
    a bottom plate;
    a guide plate installed at each end portion of the bottom plate, facing each other and separated by a predetermined distance;
    a plurality of guide grooves formed on one side surface of each guide plate and configured to receive the plurality of tray plates;
    a top plate installed at an upper portion of the guide plates;
    a plurality of alignment bars configured to align the tray plates; and
    a plurality of cylinders installed at edge portions of the top plate and configured to drive the plurality of alignment bars.

6. The stacker for a tray feeder according to claim 5, wherein each cylinder of the magazine is connected to its respective alignment bar by a link assembly.

7. The stacker for a tray feeder according to claim 6, wherein each link assembly comprises:
    a rotation shaft configured to be inserted into a predetermined portion of one edge of the top plate, and to be rotatably connected to the cylinder;

a rotation shaft support block fixed to and supported by an end portion of the rotation shaft;

a hinge connected to the end portion of the rotation shaft support block opposite the rotation shaft; and a piston connected to the hinge and configured to perform a straight line movement by the cylinder.

8. The stacker for a tray feeder according to claim 6, wherein each tray plate comprises:

a bottom surface;

support bar guides formed at opposite end portions of the bottom surface;

support jaws formed at opposite side portion portions of the tray plate and configured to be sucked to a vacuum pad of an exchange;

support bar guide jaws formed at opposite end portions of an outer surface of the support bar guide and configured to be inserted into the guide plate; and a support bar guide groove formed on an inner surface of the support bar guide and configured to receive a tray support bar.

9. The stacker for a tray feeder according to claim 8, wherein each tray plate comprises at least one tray support bar, and wherein fixed pushers having springs are connected to bottom portions of each end portion of the tray support bar, and protrusions formed extended at each end portion of the tray support bar are configured to be inserted and guided into the support bar guide groove of the tray plate.

10. The stacker for a tray feeder according to claim 5, wherein a flat surface having a predetermined width is formed on an outer surface of each of the plurality of alignment bars so as to support both end portions of one side portion of the tray plate.

11. The stacker for a tray feeder according to claim 1, further comprising an exchange configured to retrieve a selected tray plate from the magazine, and to return a tray plate to the magazine.

12. The stacker for a tray feeder according to claim 11, wherein the exchange is configured to exchange a tray mounted on the tray plate with another tray mounted on the transfer.

13. A stacker for a tray feeder, comprising:

a frame;

an elevator mounted on the frame, driven by a driver, and configured to move upwardly and downwardly;

a magazine mounted to the elevator and configured to receive a plurality of tray plates;

a plurality of tray plates, wherein each tray plate is configured to receive a tray holding a plurality of electronic parts;

an exchange configured to extract tray plates from the magazine and to return tray plates to the magazine; and a transfer configured to transfer trays of electronic parts onto and out of the tray plates.

14. The stacker for a tray feeder according to claim 13, wherein the driver comprises:

a motor;

a ball screw connected to a shaft of the motor and configured to move the elevator upwardly and downwardly; and a plurality of linear motion guides mounted on the frame and configured to guide the elevator.

15. The stacker for a tray feeder according to claim 14, further comprising a plurality of guide blocks mounted on corresponding ones of the plurality of linear motion guides so as to move along the plurality of linear motion guides.

16. The stacker for a tray feeder according to claim 13, wherein the magazine comprises:

a bottom plate;

a pair of guide plates installed at opposite end portions of the bottom plate;

a plurality of guide grooves formed on one side surface of each of the guide plates;

a top plate installed at an upper portion of the pair of guide plates;

a plurality of alignment bars configured to align the plurality of tray plates; and a plurality of cylinders installed at edge portions of one of the top plate and the bottom plate and configured to respectively drive the plurality of alignment bars.

17. The stacker for a tray feeder according to claim 16, wherein each cylinder is connected to its respective alignment bar by a link assembly.

18. The stacker for a tray feeder according to claim 17, wherein each link assembly comprises:

a rotation shaft inserted into a portion of one of the top plate and the bottom plate, and rotatably connected to a cylinder;

a rotation shaft support block fixed to and supported by an end portion of the rotation shaft;

a hinge connected to the opposite end portion of the rotation shaft support block; and a piston connected to the hinge and configured to move in concert with the movement of the cylinder.

19. The stacker for a tray feeder according to claim 13, wherein each of the plurality of tray plates comprises:

a bottom surface;

support bar guides formed at opposite end portions of the bottom surface;

support jaws formed at opposite side portions of the tray plate;

support bar guide jaws formed extended from an outer surface of the support bar guides and configured to be inserted into the guide plate;

a support bar guide groove formed on an inner surface of each of the support bar guides; and at least one support bar mounted on the support bar guide grooves of the support bar guides.

20. The stacker for a tray feeder according to claim 19, further comprising fixed pushers that are connected to bottom portions of each end portion of the at least one support bar, and wherein protrusions extend from each end portion of the at least one support bar, wherein the protrusions are configured to be inserted and guided into the support bar guide grooves.

21. The stacker for a tray feeder according to claim 20, wherein the fixed pushers comprise an energy storage device configured to maintain a predetermined amount of tension.

22. The stacker for a tray feeder according to claim 13, wherein the exchange is configured to work with the transfer to exchange a tray mounted on a tray plate with another tray mounted on the transfer.

\* \* \* \* \*